United States Patent [19]

Gulick et al.

[11] Patent Number: 5,768,109
[45] Date of Patent: Jun. 16, 1998

[54] MULTI-LAYER CIRCUIT BOARD AND SEMICONDUCTOR FLIP CHIP CONNECTION

[75] Inventors: Jon J. Gulick, Hawthorne; Craig K. Shoda, Torrance, both of Calif.

[73] Assignee: Hughes Electronics, Los Angeles, Calif.

[21] Appl. No.: 681,136

[22] Filed: Jul. 22, 1996

Related U.S. Application Data

[63] Continuation of Ser. No. 364,362, Dec. 27, 1994, abandoned, which is a continuation-in-part of Ser. No. 17,945, Feb. 12, 1993, abandoned, which is a continuation of Ser. No. 721,735, Jun. 26, 1991, abandoned.

[51] Int. Cl.$^6$ ............... H05K 1/11; H05K 7/02; H01L 23/34; H01P 1/00
[52] U.S. Cl. ............ 361/794; 174/255; 174/260; 174/261; 257/728; 333/247; 361/772; 361/774; 361/783; 361/780
[58] Field of Search ............... 174/260, 261, 174/35 R; 228/179.1, 180.1, 180.21, 180.22; 257/700, 723, 724, 728, 659, 778, 779, 735, 738; 361/760, 767, 770–774, 777, 780, 782, 783, 792–795; 439/68, 82, 83, 179, 607; 429/901; 333/246, 247; 437/209, 183

[56] References Cited

U.S. PATENT DOCUMENTS

| | | | |
|---|---|---|---|
| 3,436,819 | 4/1969 | Linine | 174/255 |
| 4,601,526 | 7/1986 | White et al. | 361/760 |
| 4,787,853 | 11/1988 | Igarashi | 174/260 |
| 4,818,728 | 4/1989 | Rai et al. | 437/209 |
| 4,868,637 | 9/1989 | Clements et al. | 257/778 |
| 4,999,136 | 3/1991 | Su et al. | 428/901 |
| 5,109,270 | 4/1992 | Nambu et al. | 257/728 |
| 5,164,818 | 11/1992 | Blum et al. | 257/778 |
| 5,266,912 | 11/1993 | Kledzik | 333/247 |
| 5,371,653 | 12/1994 | Kametani et al. | 361/794 |
| 5,400,003 | 3/1995 | Kledzik | 333/247 |
| 5,475,606 | 12/1995 | Muyshondt et al. | 361/780 |

FOREIGN PATENT DOCUMENTS

| | | | |
|---|---|---|---|
| 0191434 | 8/1986 | European Pat. Off. | 437/209 |
| 2-25100 | 1/1990 | Japan | 174/35 R |
| 2-137400 | 5/1990 | Japan | 174/35 R |
| 3-49300 | 3/1991 | Japan | 174/35 R |
| 3-110768 | 5/1991 | Japan | 439/607 |
| 5-144879 | 6/1993 | Japan | 228/180.1 |
| 1545337 | 2/1990 | U.S.S.R. | 439/179 |

OTHER PUBLICATIONS

IBM Technical Disclosure Bulletin"Tri–Lead Shielding For Printed Wiring" by E. Stephans vol. 11 No. 8, Jan. 1969.
IBM Technical Disclosure Bulletin "Plane Electrical Enhancement" vol. 32 No. 10A, Mar. 1990.
IBM Technical Disclosure Bulletin "Low Insertion Force Connector" by W.F. Beausoleil et al. vol. 11 No. 6 Nov. 1968 pp. 642 and 643.

*Primary Examiner*—Donald Sparks
*Attorney, Agent, or Firm*—Leonard A. Alkov; Wanda K. Denson-Low

[57] ABSTRACT

A multi-layer circuit board (11) has a cofired ceramic with a configuration of circuit traces (27) extending though differing layers of the multi-layer circuit board (11) to facilitate mountable conductive contact with semiconductor flip chips (13). Via holes (23) are precisely formed in the multi-layer circuit board (11) and are filled with solder or conductive epoxy. Semiconductor chips (13) have an array of metallic posts (19) alignable with the holes (23) and are mounted upon the upper surface of the multi-layer circuit board (11) in plug fashion. An aperture (25) may be formed in multi-layer circuit board (11) directly below each semiconductor chip (13) for protection of the circuitry on semiconductor chip (13) from contact with multi-layer circuit board (11). The via holes (23) and transmission line structure of the circuit board (11) are precisely formed to achieve a desired characteristic impedance.

21 Claims, 4 Drawing Sheets

MULTI-LAYER CIRCUIT BOARD AND SEMICONDUCTOR FLIP CHIP CONNECTION

This is a continuation of application Ser. No. 08/364,362, filed Dec. 27, 1994, now abandoned, which is a continuation-in-part of U.S. patent application Ser. No. 08/017,945 filed Feb. 12, 1993 now abandoned, which is a continuation of U.S. patent application Ser. No. 07/721,735 filed Jun. 26, 1991, now abandoned.

BACKGROUND OF THE INVENTION

1. Field of the Invention

The present invention is generally related to semiconductor chip mounting and, more particularly, to a package and process for flip chip mounting and bonding onto a multilayer circuit board.

2. Description of Related Art

With increasing packaging density and device operation speed (digital) or operating frequency (analog), new challenges have been imposed in the field of electronic packaging. New packaging techniques such as tape automated bonding are quickly replacing wire bonding in many areas. The conventional packaging approach is a two step process. First, the semiconductor chip is attached (face-up fashion) to the substrate or metallic carrier using a conductive epoxy adhesive or eutectic solder bond. Second, the interconnect operation, wherein electrical continuity between the chip and the rest of the circuitry is established, is completed by wire bonds. Even with automated assembly procedures, this approach is time consuming and defect prone - missing or ineffective wire bonds, for instance. Flip chip bonding is a viable substitute for and utilizable in addition to tape automated bonding.

There are several ways to attach a die to a substrate. One common approach uses non-conductive or conductive epoxy for die to substrate attachment. In this technique, the die is glued to the substrate and the epoxy is cured for good die attach. A second method, which involves a eutectic die attach, is used in most military applications and in cases where heat conduction is important. A gold/tin solder preform on the substrate is brought in contact with the semiconductor and with the aid of temperature, about 360° C., the eutectic point is reached and attachment occurs. These techniques require gold or aluminum wires to be bonded on the output pads of the device. Due to the complexity of today's circuits, many output pads exist requiring many wires to be bonded. There also is the demand to attach more than one circuit on a substrate for space economy.

Early attempts to get away from wire bonding were successfully implemented with the beam lead technology in which thin gold leads protrude from the edge of the device via a special metallization process. The device is flipped over and a special wobbling tool attaches all the beams to substrate in one motion.

Another technique which is widely used is tape automated bonding. A special frame with the configuration of the output pads on the chip is placed over the chip. A heated bonding tool is lowered to apply pressure and temperature for thermocompression bonding. Another method of implementing this same idea is to use solder for frame attachment to the die. Tape automated bonding packaging fits very well with automation where a spool with the frame is moved over dies which are placed on a chuck.

The aforementioned packaging techniques do not fit well with multi-chip hybrid or chip on board packaging. There is a growing tendency to mount many chips on one substrate for increased density and increased operating speed of the device. Renewed interest has surfaced in the technique of flip chip bonding.

The heretofore conventional flip chip approach for packaging semiconductor devices has been previously used with integrated circuits and prior art for that approach can be found in the technical literature. Flip chip is just now emerging as a viable packaging approach for GaAs devices operating at microwave and millimeter wave frequencies. Flip chip bonding lends itself to high packaging densities, faster circuits, and eliminates wire bonding. Various methods to obtain reliable processes are being investigated by many corporations. In general, a metal bump is grown on the chip, the substrate, or both. The chip is flipped over, aligned to the substrate, and bonded. The "bumped" chip is elevated from the surface of the substrate by the height of the bumps and electrical connection occurs on the top layer. There are basically four different methods being investigated.

The most common method is the use of solder balls "grown" on the output pads of the die and the substrate. As mentioned before, the die is flipped over, aligned to the substrate, and bonded by heating the solder to the reflow point. Die alignment with the substrate is through the mechanism of the surface tension of the solder.

Gold bump to gold or aluminum pads are used in conjunction with thermocompression bonding. Heat and pressure are used to achieve a reliable contact between the die and the substrate. A variation on the theme can be the use of ultrasonic bonding of gold to gold after the alignment and contact.

Indium is also used for flip chip bonding. Indium is used mainly where cryogenic temperatures are required for the operation of the device. One of the main applications is for focal plane arrays and special detectors. Indium is deposited on the die and substrate by plating, or evaporation and lift-off technique to obtain the bumps.

Conductive epoxy also is utilizable for flip chip bonding. The epoxy can be screened on the substrate and the operation is similar to the process explained before.

One of the big problems facing the packaging process today is the mismatch between the substrate and the die. Alignment of the chip to the substrate depends on the surface tension forces in the solder during the reflow operation or placement accuracy if conductive epoxy is used. Additionally, in the case of solder, containment dams are required to prevent solder from wicking along the circuit traces during reflow. One solution to the problem of alignment includes the possibility of using reflected IR illumination to look through the device and see the contacts on the flipped die and the substrate simultaneously, in conjunction with an IR autocollimator to ensure that the sample is parallel to the substrate. The normal flip chip approach, however, suffers disadvantages as well, especially when used with GaAs MMIC devices. The air gap between the chip and the substrate is difficult to control because it depends on both the bump height and the adhesive height (solder or conductive epoxy).

Unfortunately, the infrared flip chip alignment requires the back of the flip chip to be polished and not metallized, open areas in the front metallization are required in order to be able to see the substrate. Furthermore, the resistivity of the flipped die has to be high enough to allow the IR light to penetrate. Most integrated circuits do not fulfill these requirements, and such light alignment system is expensive and cumbersome.

A circuitry system is needed which offers the savings of the flip chip system but with reliable alignment to insure proper connection. Control of the air gap between the chip and the mounting substrate is also needed especially with higher frequency systems.

Advanced semiconductor flip chip packaging requires bump connections to be located close together to reduce the size of the chip and provide a closer bump spacing. To accomplish this, holes in the circuit board must be formed precisely to within an acceptable tolerance. Also, circuit traces within the circuit board may require a high density configuration. Generally speaking, many of the conventional packaging approaches fail to take into consideration the need for precise hole locations and precise hole dimensions.

Additionally, current and future transmission line structures such as microstrip, stripline, coplanar waveguides and slotline structures often require characteristic impedance matching. With a microstrip transmission line, the characteristic impedance is generally a function of the signal transmission line width, the dielectric constant of the dielectric material and the spacing between the signal transmission line and the ground planes. The typical conventional chip packaging approaches generally do not provide impedance matching through the electrical connection. The performance of high frequency circuits is strongly dependent on proper matching between circuit elements and the connecting transmission line. Variations in the characteristic impedance can cause unacceptable circuit performance, especially at microwave and millimeter wave frequencies.

It is therefore desirable to provide a packaging arrangement for mounting a semiconductor flip chip to a multi-layer circuit board. More particularly, it is desirable to provide electrical connections between circuit traces within a multi-layer circuit board and contact bumps extending from the semiconductor flip chip. It is also desirable to achieve precise location and size of the via holes and cavities. It is further desirable to maintain a desired characteristic impedance through the signal connections, especially for microwave and millimeter wave signal operations.

SUMMARY OF THE INVENTION

This invention utilizes a multi-layer circuit board or substrate and the semiconductor flip chip or chips. Metallic posts, or bumps, are formed at each input/output pad of a chip, typically by an electroplating process. This "bumped" chip is then mounted in flip chip fashion to the mating substrate, that is, with the circuit side of the chip and its array of bumps adjacent to the substrate.

The multi-layer circuit board is fabricated from a plurality of individually processed dielectric tape layers which are laminated together and fired to form a cofired ceramic structure. An array of via holes is precisely drilled, according to a preferred embodiment, in the top layers of the substrate and partially filled with either solder or conductive epoxy. The array of via holes, so arranged as to be the mirror image of the array of bumps on the semiconductor chip, serves as a socket for the IC. The circuit traces that are required to mate with the chip are buried in the multi-layer substrate between differing layers and terminate in the via holes, thus establishing electrical continuity between the input/output pads on the chip and the circuit traces in the substrate. The circuit traces provide a transmission line structure with signal transmission lines separated from accompanying ground planes in a microstrip or stripline configuration or the like. The holes are precisely formed and the ground planes properly located so as to achieve a desired characteristic impedance through the signal transmission paths.

This invention permits more than one device per substrate. Multiple chips, including a mixture of gallium arsenide millimeter wave integrated circuits, silicon IC's, and discrete devices, can all be integrated on a single substrate with the requisite mating sockets. Interconnection between these devices is accomplished with the buried circuit traces.

This invention eliminates each of these drawbacks of a normal flip chip. It features self-alignment of the chip to the substrate and a built-in solder or epoxy containment mechanism. Also, by cutting cavities in one or more layers of the multi-layer board directly below the chip, precise control of the air gap height is achieved. Furthermore, the multi-layer circuit board, can be fabricated to achieve a desired characteristic impedance for a transmission path.

BRIEF DESCRIPTION OF THE DRAWINGS

Other objects and advantages of the present invention will become apparent to those skilled in the art upon reading the following detailed description and upon reference to the accompanying drawings in which.

DESCRIPTION OF THE PREFERRED EMBODIMENTS

Figure 1:
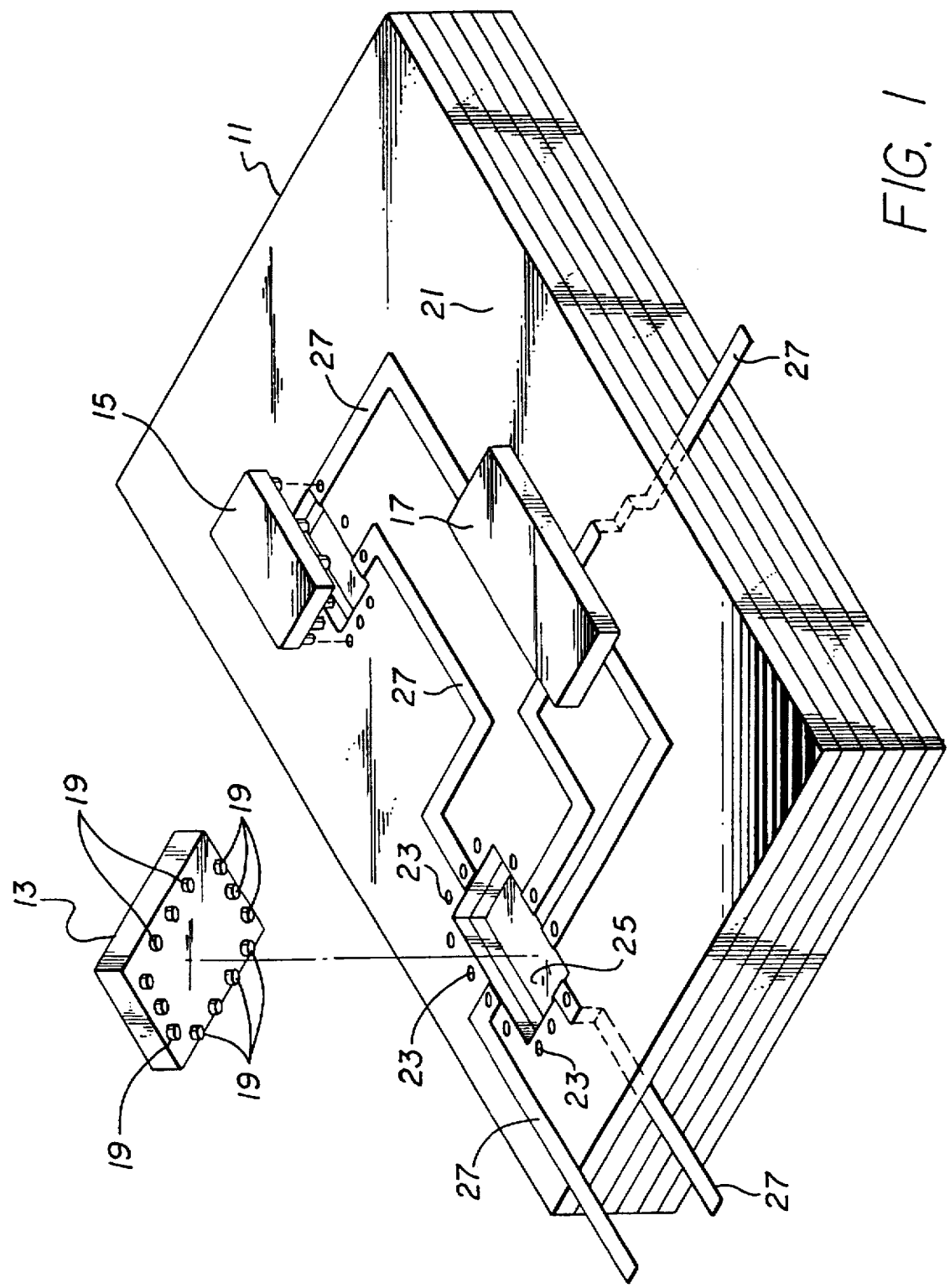
FIG. 1 is a perspective view of a multi-layer circuit board illustrating attachment and carriage of the semiconductor chip of the present invention including layout of the conductors.

Referring to FIG. 1, a multi-layer circuit board 11 is illustrated in perspective view. Multi-layer circuit board 11 is shown sectionally about its periphery, and a series of horizontal lines illustrate the interstices representing the narrow spaces between the circuit board layers. A series of three semiconductor chips are shown in various stages of attachment, and are referred to generally with the reference numerals 13, 15 and 17, respectively.

Semiconductor chip 13 is illustrated high over multi-layer circuit board 11. On one side of semiconductor chip 13 are a series of metallic posts 19 distributed along the edges of semi-conductor chip 13. The metallic posts 19 may be formed by successive layers of electrode deposited metal, or electrodeposition. Alternatively, metallic posts 19 may be affixed by any known manner necessary to impart conductive attachment of metallic posts 19 with the circuitry of semiconductor chip 13. Semiconductor chip 13 contains circuitry as is well known for semiconductor chips based upon the location and interrelationship of doped silicon or gallium arsenide which is known in the art to produce transistors, diodes, and other circuit elements constructed therefrom.

Multi-layer circuit board 11 has an upper surface 21 into which are formed a series of holes 23 in a pattern matching the array of metallic posts 19 at the bottom of semiconductor chip 13. As is shown in dashed line format, semiconductor chip 13 is lowered toward the upper surface of multi-layer circuit board 11 in order to bring metallic posts 19 within their matching holes 23 formed in the upper surface 21 of multi-layer circuit board 11.

In this manner, the semiconductor chips 13, 15 and 17 are initially mounted in "socket" fashion. The "sockets" are formed in a section of a multi-layer circuit board with the formation of holes 23. Before attachment of the semiconductor chips 13, 15 and 17 are mounted, solder or conductive epoxy is deposited into each hole 23. The chips are then plugged into the holes 23 much as a common Dual In-line Package integral circuit would be plugged into a standard socket.

Note that an aperture 25 is formed in the upper two layers of multi-layer circuit board 11. Note that aperture 25 has a rectangular shape generally matching the rectangular shape of semiconductor chip 13 and has edges extending adjacent to holes 23.

As is somewhat more readily shown with regard to semiconductor chip 15, the body of the semiconductor chip 15 fits over the aperture 25 formed in the upper two layers of the multi-layer circuit board 11. The degree of overlap of semiconductor chips 13, 15 and 17 onto multi-layer circuit board 11 is practiced to the extent necessary to support the semiconductor chips 13, 15 and 17, and to provide enough material about holes 23 to ensure that any conductive material within holes 23 remains isolated and securely intact.

It is understood that aperture 25, upon mounting of the semiconductor chips 13, 15 and 17, forms an air gap to provide an adjacent volume. In order to prevent the substrate from coming into contact with the delicate circuitry on the surface of the semiconductor chips 13, 15 and 17, aperture 25 allows a sufficient clearance. At those locations where contact between the semiconductor chips 13, 15 and 17 and the substrate does occur only non-fragile circuit components are present. It is to be understood that the volume of the air gap may be increased or decreased by extending aperture 25 into greater numbers of successive layers of multi-layer circuit board 11. The two apertures 25 illustrated are two layers deep; however they may be made one, three, or more layers deep as are necessary to ensure proper operation of semiconductor chips 13, 15 and 17.

For many devices, particularly GaAs MMIC devices, the air gap height $H_G$ dimension is determined by the number of layers through which the cavity is formed. Since the thickness of each layer can be precisely controlled the overall air gap height $H_G$ is also controlled.

In the case of FIG. 1, the general shape of aperture 25 matches the general shape of semiconductor chips 13, 15 and 17. It is to be understood, however, that the aperture 25 may be of any shape necessary to provide the proper air gap volume and spacing. It is anticipated that proper volume and spacing will depend upon the circuit densities and requirements of those circuits on semiconductor chips 13, 15 and 17.

In communication with holes 23, a series of traces, or conductive traces 27 extend between the layers of multi-layer circuit board 11., and at some level they approach one of holes 23. The buried circuit conductive traces provide an interconnection between the mounted semiconductor chips 13, 15 and 17 and the rest of the circuitry in multilayered circuit board 11. As will be later shown, the ends of conductive traces 27 which terminate within the boundary of multi-layer circuit board 11 are in communication with holes 23. As will be the case in a typical circuit system, some of the conductive traces 27 extend between one or more of the semiconductor chips 13, 15 and 17, while other of the conductive traces 27 extend to points off of the multi-layer circuit board 11 boundary.

Note that semiconductor chip 17 is in its fully supported and mounted position. Semiconductor chip 17 is vertically supported by the upper surface 21 of multi-layer circuit board 11. Semiconductor chip 17, similar to those shown for semiconductor chips 13 and 15, has a series of metallic posts 19 (not shown for semiconductor chip 17) which are in conductive contact with conductive traces 27. The metallic posts 19 of semiconductor chip 17, which extend into holes 23 of multi-layer circuit board 11, lend further lateral support to the mounting integrity of semiconductor chip 17.

Figure 2:
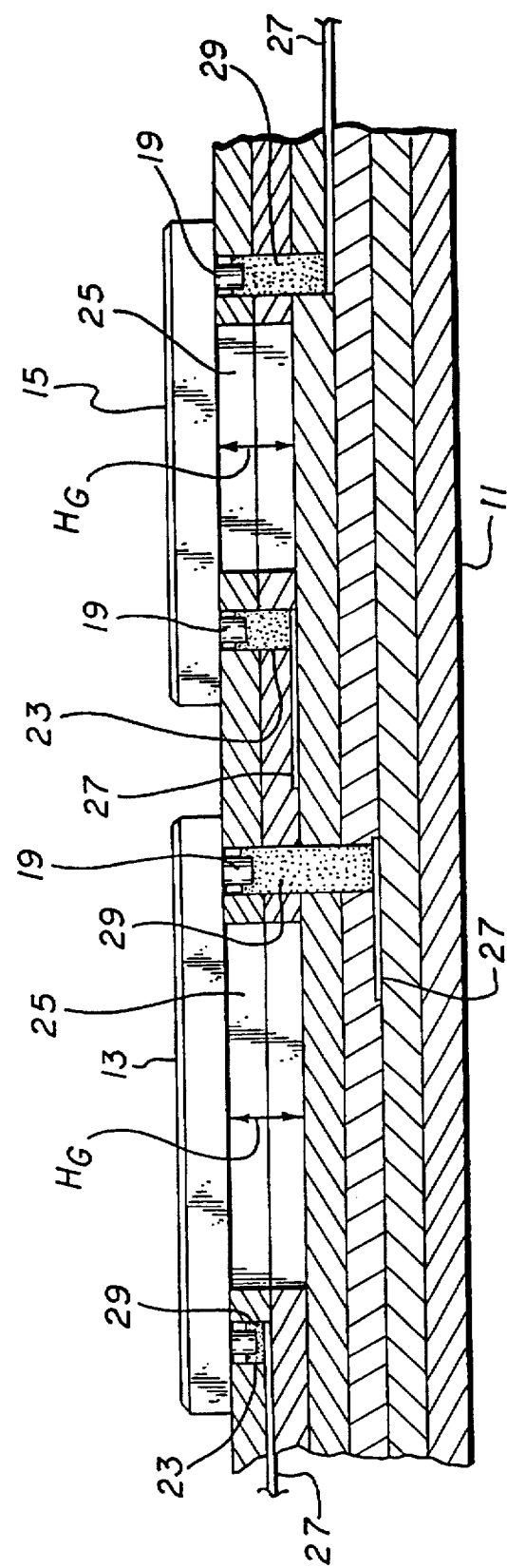
FIG. 2 is a sectional view illustrating the multi-layer construction of the circuit board of FIG. 1.

Referring to FIG. 2, an enlarged sectional view of the multi-layer circuit board 11 of FIG. 1 is illustrated. Semiconductor chips 13 and 15 are shown in their fully mounted positions. In mounted position, note that each of the metallic posts 19 extend partially into the holes 23. Note that the conductive traces 27 are exposed at the bottom of holes 23. Note that the exposure of the conductive traces 27 at the bottom of holes 23 may occur at differing levels within multi-layer circuit board 11 to facilitate the advantageous routing of such conductors.

To complete contact between the metallic posts 19 and that portion of the conductive traces 27 exposed at the bottom of holes 23, a conductive filler material 29 is provided in holes 23 sufficient to ensure contact between metallic posts 19 and conductive traces 27. Conductive filler material 29 may be either a conductive epoxy or any suitable type of solder.

Figure 3:
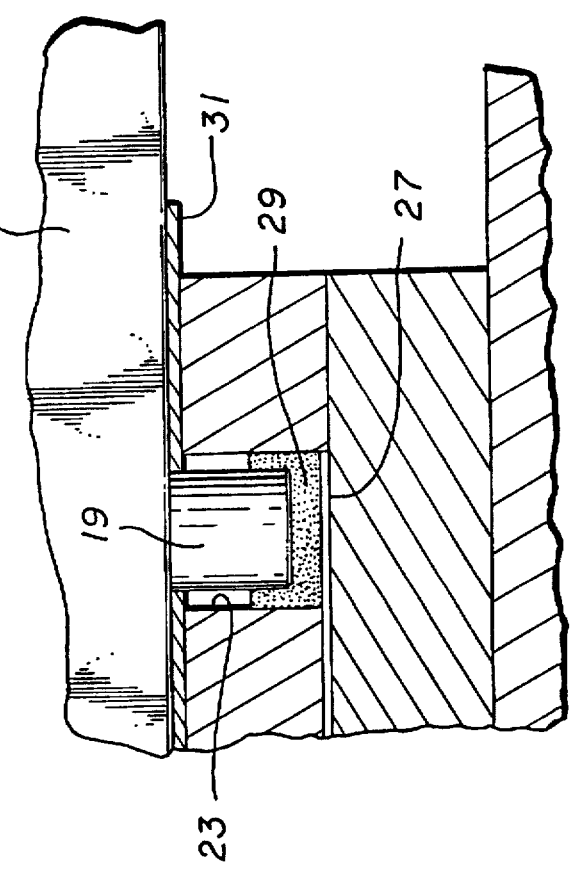
FIG. 3 is an enlarged view of the sectional view of FIG. 2.

Referring to FIG. 3, a closeup of the sectional view of FIG. 2 is further illustrated. Note that enough conductive filler material 29 must exist within hole 23 to ensure sufficient contact between the conductive traces 27 exposed at the base of hole 23 and the bottom and lower side surfaces of metallic posts 19. Pursuant to this goal, it is clear that holes 23 must be adequately filled with conductive filler material 29 in order that good contact is made, but not overly filled such that the conductive filler material 29 is forced out of hole 23 by virtue of the displacement of metallic post 19. Displacement of the conductive filler material 29 could cause contact between adjacent metallic posts 19 as well as form a planar conductor in the interstitial area between the bottom surface of semiconductor chip 13 and the upper surface 21 of multi-layer circuit board 11.

In addition, the embodiment of FIG. 3 illustrates a dielectric, or glass passivation layer 31 applied adjacent the bottom layer of semiconductor chips 13, 15 and 17. Glass passivation layer 31 acts to protect those circuit components and conductive traces 27 at or adjacent the bottom layer of semiconductor chips 13, 15 and 17 which otherwise come into touching contact with the upper surface 21 of multi-layer circuit board 11. In typical applications, protection of the traces is provided by a glass passivation layer on the semiconductor chip. All fragile circuit features, such as the air bridges, are situated over the cavity. In addition, and as an option, the glass passivation layer 31 can be dimensionally toleranced to a very close fit around metallic posts 19 to inhibit the flow of conductive filler material from making contact with any portion of the lower surface of semiconductor chips 13, 15 and 17.

The packaging arrangement disclosed in connection with this invention enjoys many advantages over the conventional wire bonding approach for packaging semiconductor chips. This invention accomplishes semiconductor chip 13 attachment and interconnect simultaneously, leading to reduced assembly cycle time and reduced cost. This resulting multilayered circuit board 11 package results in higher reliability than the conventional package since the inherently unreliable wire bonds have been eliminated. Better performance and repeatability are other important advantages of this invention because the wire bonds, with their associated inductance variations, have been replaced by highly consistent and reliable electroplated metallic posts. This invention has wide applicability to both military and commercial product lines. Radar transmit/receive modules represent a primary target application for this invention. It has been determined that in order for the transmit/receive module to be affordable and reliable, the wire bond interconnect must be eliminated. More generally, for any situation where semiconductor devices are used, improved reliability, reduced cost, reduced cycle time and improved performance are possible through the use of this invention. These features are beneficial to both military and commercial applications.

Another advantage of this invention as thus far described has to do with the containment of the solder or epoxy. In typical flip chip applications one must provide some type of containment mechanism that prevents the solder or epoxy from wicking along the circuit traces or flowing away from the input/output pad. This mechanism usually takes the form of a layer of dielectric material deposited across the circuit traces or an annular ring of dielectric material that encircles each input/output pad. In this invention the containment feature is built-in, since the solder or epoxy is deposited into the holes 23 in the substrate.

Finally, no special alignment methods are required with the present invention. Once the semiconductor chips 13, 15 and 17 are plugged into the multi-layer circuit board 11, it is captured and any subsequent solder reflow or epoxy curing operations can be performed without having to maintain this alignment. In fact, all chips in the assembly can be plugged into their respective sockets and heated to reflow the solder or to cure the epoxy for all the devices at the same time.

Figure 4:
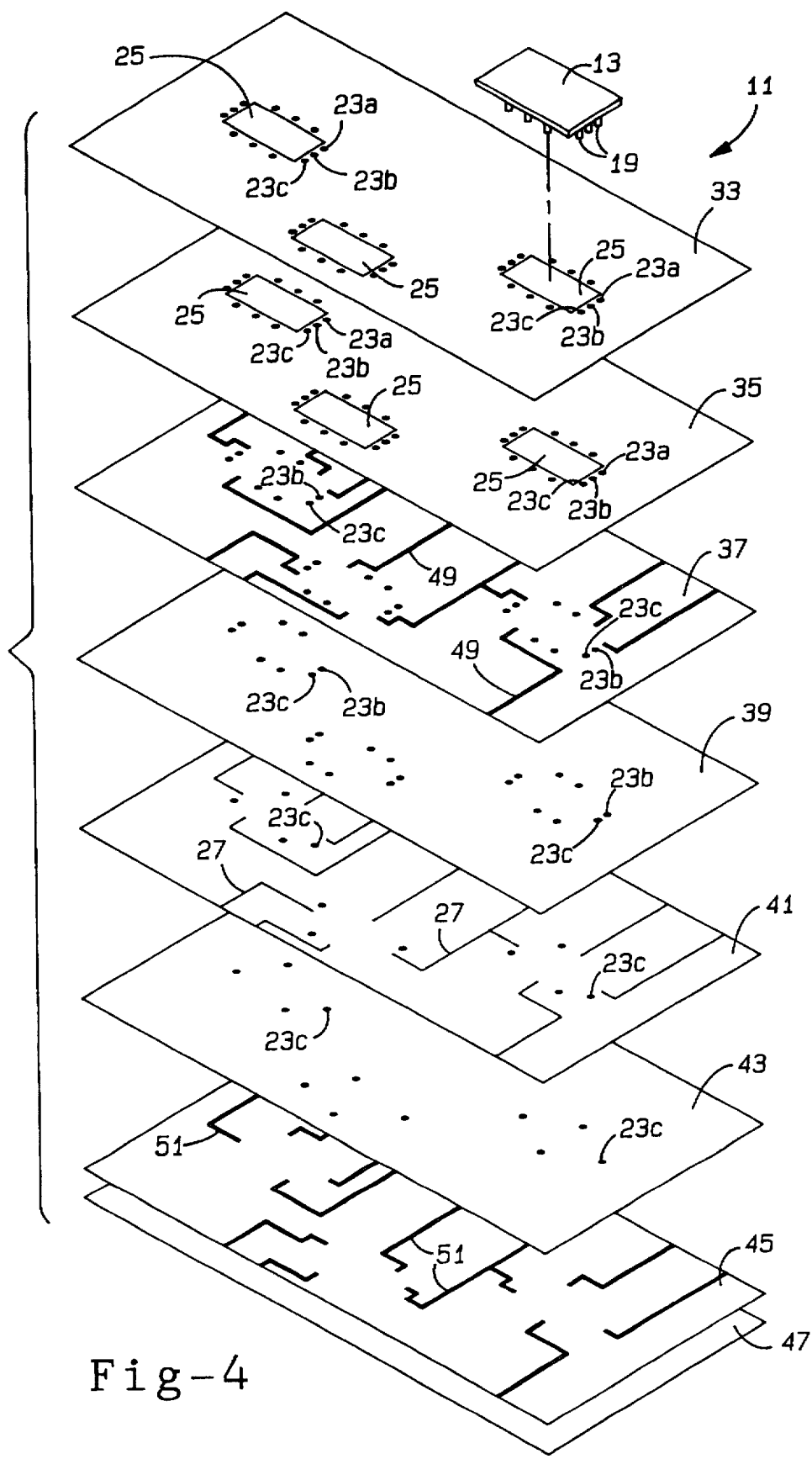
FIG. 4 is an exploded view of the multi-layer circuit board illustrating lamination of individual dielectric tape layers according to the present invention.

To further enhance high frequency signal operations, the packaging arrangement of the present invention preferably implements a multi-layer circuit board 11 made up of cofired ceramic material.. Turning now to FIG. 4, the preferred implementation of multi-layer circuit board 11 is shown in an exploded view made up of a plurality of separated dielectric tape layers 33, 35, 37, 39, 41, 43, 45 and 47. Preferably, the dielectric tape layers 33–47 are individually processed to form precise openings and to fabricate any circuit components thereon or provide other features associated with a given layer. The dielectric tape layers $33 \geq 47$ are then brought into alignment with each other and laminated together and fired to form a single multi-layer circuit board 11. According to a preferred embodiment, multi-layer circuit board 11 is fired at a relatively low temperature of approximately 850 C., for example, to cure the laminated circuit board and provide a Low Temperature Cofired Ceramic (LTCC) which is capable of achieving high performance signal operations at microwave frequencies.

A more detailed description of the individual processed dielectric tape layers 33–47 is as follows. Each of the individual dielectric tape layers 33–47 includes a thin dielectric tape material such as a Low Temperature Cofired Ceramic (LTCC) part number 851AT, manufactured and sold by E.I. dupont de Nemours & Co., Inc. The above cited dielectric material has a rated relative dielectric of approximately 7.1. Dielectric material such as that identified above is typically available in layered sheets of tape with a thickness of between 0.003 and 0.010 inches per layer, for example. The thickness of each of dielectric tape layers 33–47 is chosen depending on the dielectric constant of the material and the distance needed between adjacent signal transmission paths on differing layers. It should be understood that the thickness of each of tape layers $33 \geq 47$ can be controlled to within +/−5% after firing. Accordingly, a precise dielectric separation can be achieved.

Several of the dielectric tape layers 37–43 have a plurality of via holes 23 precisely drilled therethrough. The via holes 23 are formed in the individual layers 37–43 with a precise laser drilling process. It should be appreciated that laser drilling can typically provide a high precision tolerance to within 0.001 inches to achieve the desired location and to achieve precise hole dimensions. Alternately, other high precision hole forming techniques could be employed. In addition, three apertures 25 are likewise precisely drilled through a selected number (two are shown) of dielectric layers.

With reference to top dielectric tape layer 33, a number of via holes 23a, 23b and 23c and apertures 25 are shown formed therein. Likewise, the same configuration of via holes 23a, 23b and 23c and apertures 25 are shown formed in the second dielectric tape layer 35 directly below layer 33. The third dielectric tape layer 37 is individually processed to include a grounded circuit trace 49 fabricated on top thereof. Grounded circuit trace 49 is preferably printed on the top surface of layer 37 with a screen printing process or other similar techniques. The ground circuit traces 49 provides an upper ground plane and is configured to line up with and communicate with a selected number of the via holes 23a formed in the above dielectric tape layers 33 and 35.

Via holes 23b and 23c are likewise drilled in dielectric tape layer 37 and configured to match and communicate with via holes 23b and 23c in layers 33 and 35 so as to allow for the metallic posts 19 and associated conductive filler material to extend therethrough to the lower layers. The fourth dielectric tape layer 39 is located directly below dielectric layer 37 and has similar via holes 23b and 23c configured in a like configuration to match and communicate with the via holes 23b and 23c provided in the above dielectric layer 37.

The fifth dielectric tape layer 41 has a configuration of conductive circuit traces 27 fabricated thereon to provide signal transmission paths. The circuit traces 37 are configured to line up with and communicate with selected via holes 23b in the above dielectric layers 33–39. As shown, ends of buried circuit trace 27 terminate within the corresponding via holes 23b. This allows for metallic posts 19 and the cooperating conductive filler material 29 to extend into the selected via holes 23b and electrically contact the top surface of circuit trace 27. Accordingly, a continuous signal transmission path is provided through each of the corresponding metallic posts 19, conductive filler material 29 and circuit trace 27.

The sixth dielectric tape layer 43 has precisely drilled via holes 23c which account for the remainder of the protruding via holes 23. The seventh dielectric tape layer 45 has a grounded circuit trace 51 fabricated on top thereof for providing a lower ground plane. Grounded circuit trace 51 is printed on the top surface of dielectric layer 45 in a manner similar to the formation of grounded circuit trace 49.

This may be accomplished with a screen printing techniques or the like. Grounded circuit trace 51 is configured to line up with and communicate with the via holes 23c provided in the above tape layers 33–43. Directly below layer 45 is a bottom dielectric tape layer 47 which offers dielectric isolation on the bottom side of circuit board 11.

The multi-layer circuit board configuration as shown in FIG. 4 provides for a stripline circuit configuration with ground planes provided by grounded conductive traces 49 and 51 above and below the signal transmission paths provided by circuit trace 27. The circuit pattern of ground conductive traces 49 and 51 preferably closely matches the signal transmission path configuration of circuit trace 27. By properly selecting the desired thickness of each layer and number of dielectric tape layers between signal transmission trace 27 and the respective ground planes formed by grounded traces 49 and 51, the characteristic impedance of the signal transmission path along circuit trace 27 can be properly controlled. This is important for realizing good quality high frequency signal transmissions, especially those in the microwave and millimeter wave frequency range.

Figure 5:
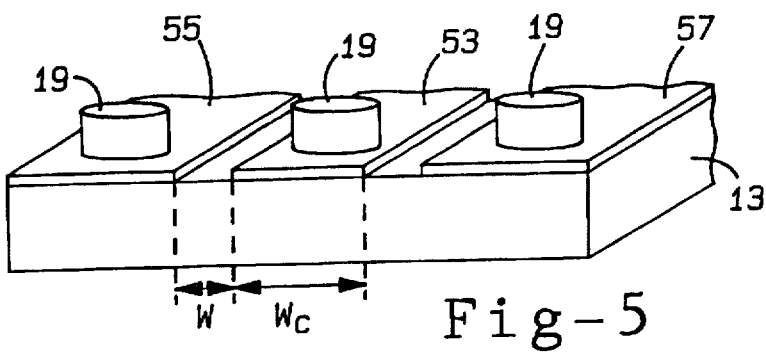
FIG. 5 is a partial view of a semiconductor flip chip with a coplanar waveguide circuit arrangement according to one embodiment of the present invention.

With particular reference to FIG. 5, the flip chip 13 is illustrated according to a coplanar waveguide transmission line structure. The flip chip 13 in FIG. 5 includes a signal transmission line 53 separated on one side from a first conductive ground line 55 and separated on the other side from a second conductive ground line 57. Signal transmission line 53 has a known conductor width WC. Each of the conductive ground lines 55 and 57 are separated from signal transmission line 53 by a separation width W. By properly selecting the conductor width WC of line 53 and the separation width W between each of lines 55 and 57 and line 53, a desired characteristic impedance on the signal transmission line 53 can be achieved. The metallic posts 19 are shown fabricated on top of the signal transmission line 53 and conductive ground lines 55 and 57.

Figure 6:
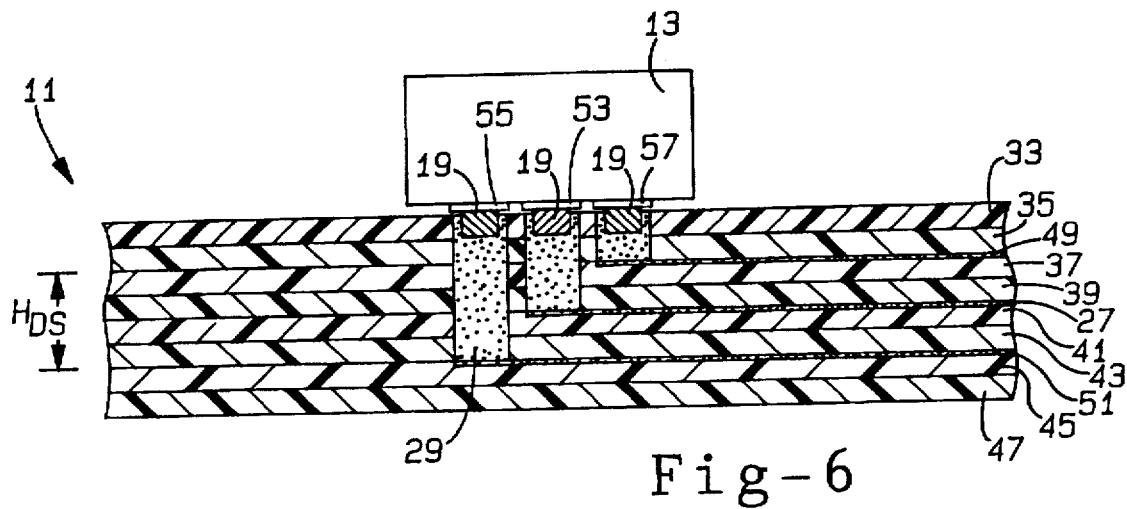
FIG. 6 is a cross-sectional view illustrating the semiconductor flip chip of FIG. 5 mounted on a multi-layer circuit board which has a stripline circuit arrangement.

Referring to FIG. 6, the flip chip 13 implementing the coplanar waveguide transmission line structure of FIG. 5 is shown mounted on the multi-layer circuit board 11. To accomplish the semiconductor chip-to-board mounting of the present invention, the flip chip 13 is turned over so that the metallic posts 19 face downward and can be inserted into the matched configuration of via holes 23 which are filled with the conductive filler material 29 as described above. It should be appreciated that the conductive material 29 is heated to a temperature of approximately 280° C. or 125° C. to achieve solder reflow or epoxy curing, respectively. The reflow or curing temperature is well below the circuit board firing temperature. According to this example, the metallic post 19 fabricated on signal trace 53 is able to achieve electrical connection with the signal transmission circuit trace 27 in multi-layer circuit board 11. In a likewise manner, the metallic posts 19 fabricated on each of conductive ground lines 55 and 57 achieve electrical connection to the respective upper and lower ground conductive traces 49 and 51 in different layers of circuit board 11.

The circuit configuration provided according to the present invention advantageously provides for continuous impedance matching of the signal transmission layers throughout the circuit board 11, flip chip 13 and the connection provided therebetween. This is achieved by precisely controlling the physical parameters of the conductive and non-conductive materials such as width of the signal transmission conductors and distance between the conductors and ground. With a stripline circuit, the height $H_{DS}$ between parallel ground planes is precisely controlled during fabrication of circuit board 11. The diameter of the via holes 23, the relative placement between the via holes 23 and the depth to which the via holes 23 extend within the dielectric tape layers are all precisely controlled to realize such a characteristic impedance.

While a low temperature cofired ceramic multi-layer circuit board 11 has been described according to a preferred embodiment, it should be appreciated that High Temperature Cofired Ceramic (HTCC) structures may likewise be used. Such a high temperature approach would preferably include a similar lamination process, however, the firing occurs at a much higher temperature of say approximately 1100° C., for example. In doing so, the technique of using the individual tape layers to form a high frequency elements remains the same for either high temperature or low temperature cofired ceramic. However, for the high temperature firing, fabricated components should be chosen to withstand the higher temperature.

Figure 7:
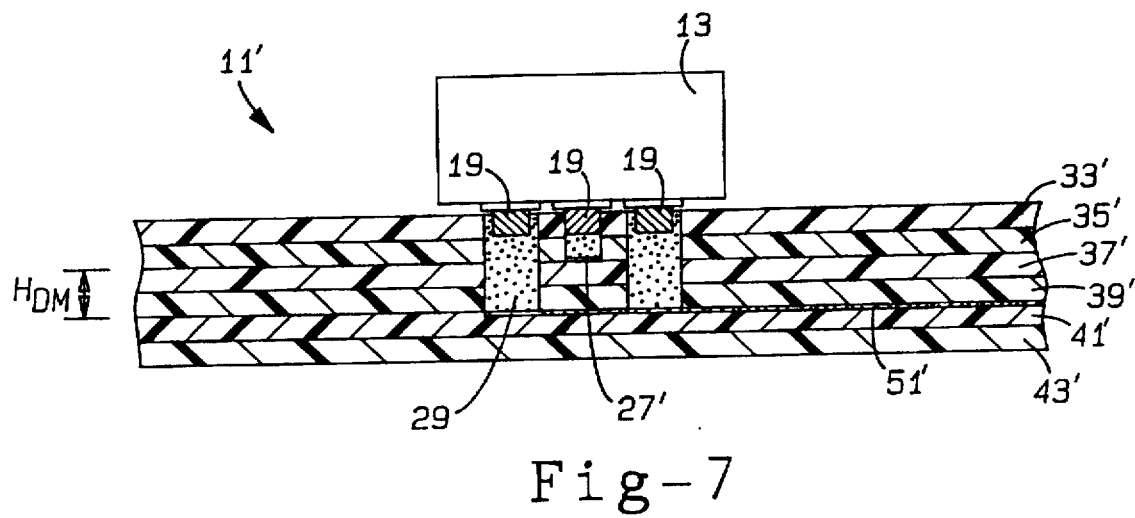
FIG. 7 is a cross-sectional view of the semiconductor flip chip mounted on an alternate embodiment of the multi-layer circuit board implementing a microstrip circuit arrangement.

The multi-layer circuit board 11 of the present invention may alternately implement a microstrip circuit configuration according to a second embodiment of circuit board 11' provided in FIG. 7. According to the second embodiment, the multi-layer circuit board 11' has six dielectric tape layers 33'–43' which are likewise each individually processed as previously mentioned, aligned relative to one another, laminated together and thereafter fired to form a cofired ceramic. However, the embodiment of circuit board 11' has a single ground plane in parallel with each signal transmission path to form a microstrip circuit configuration. The ground plane is provided by conductive ground trace 51' fabricated on top of dielectric tape layer 41'. According to this approach, the metallic posts 19 formed on conductive ground lines 55 and 57 of flip chip 13 both extend into via holes 23a and 23c and are electrically coupled to the conductive ground trace 51'. Conductive ground trace 51' is located below and dielectrically separated from signal trace 27' via a controlled thickness $H_{DM}$ of dielectric provided by layers 37' and 39' to provide a desired characteristic impedance through signal transmission line 27'. It should be appreciated that the conductive ground plane could alternately be located above circuit trace 27'.

While the semiconductor chip-to-board mounting of the present invention is illustrated herein in detail with reference to multi-layer circuit boards 11 and 11' with a stripline configuration and a microstrip configuration, respectively, other similar transmission line structures may be implemented. For example, a coplanar waveguide transmission line structure may similarly be formed within the multi-layer circuit board 11. Likewise, a slotline transmission line structure may be fabricated within multi-layer circuit board 11. In either case, it is preferred that the characteristic impedance for a given transmission path be maintained at a substantially uniform impedance so as to provide acceptable signal transmission performance which is capable of handling microwave and millimeter wave frequency applications.

The present invention advantageously allows for mounting of high density semiconductor flip chips onto a high density multi-layer circuit board. The precision of the drilled via holes and precise fabrication of the multi-layer circuit board allows for precise control of the signal transmission lines, ground planes and dielectric separation layers. As such, one can achieve a desired characteristic impedance through the signal transmission path so as to enhance high frequency signal transmissions.

The foregoing disclosure and description of the invention are illustrative and explanatory thereof, and various changes in the dimensioning, materials of construction and method for mounting the semiconductor chips, as in the details of the illustrated construction, may be made without departing from the spirit and scope of the invention.

What is claimed is:

1. A circuit comprising:
   a multi-layer circuit board including a substrate having a top face and conductive traces extending through its volume between differing layers, and a series of holes extending from a surface of the circuit board into its volume a sufficient length through one or more of said layers to expose a portion of said conductive traces associated therewith, wherein said conductive traces include signal transmission lines and ground lines configured so as to provide a desired characteristic impedance in selected signal transmission lines and said holes are precisely located to achieve said desired characteristic impedance through the selected signal transmission lines so as to provide predetermined signal transmission performance for microwave or millimeter wave frequencies, wherein said multi-layer circuit board comprises a cofired ceramic substrate having a plurality of dielectric layers which separate the signal transmission lines from the ground via controlled thickness of said dielectric layers;
   a conductive material in each of said series of holes and contacting the exposed portion of the conductive traces;
   a semiconductor flip chip having a series of metallic bumps extending from input-output pads and connected to circuitry on the chip and extending into said holes, the metallic bumps being in contact with said conductive material thereby making electrical connection to the traces via said conductive material; and
   at least one cavity formed through one or more layers of said board, said cavity having edges adjacent said holes and a volume beneath said chip for providing an air gap with a selected thickness for protecting circuitry on said chip and further improving high frequency signal operations.

2. The circuit of claim 1 wherein said circuit traces form a stripline circuit configuration.

3. The circuit of claim 1 wherein said circuit traces form a microstrip circuit configuration.

4. The circuit of claim 1 wherein said each of said holes are laser drilled.

5. The circuit of claim 1 where said conductive material comprises solder.

6. The circuit of claim 1 where said conductive material comprises conductive epoxy.

7. The circuit of claim 1 wherein said metallic bumps comprise electrodeposited metal.

8. The circuit of claim 1 wherein a dielectric passivation layer is connected to said semiconductor chip which extends between said semiconductor chip and said circuit board, said dielectric layer being formed close to said metallic bumps so as to prevent the flow of said conductive material from said holes.

9. The circuit of claim 1 further comprising a plurality of said semiconductor chips on said circuit board.

10. The circuit of claim 1 wherein said conductive traces have said exposed portion located on a bottom side of the associated hole.

11. The circuit of claim 1 wherein said flip chip has a bottom face lying substantially flush against portions of the top face of the circuit board.

12. The circuit of claim 1 wherein said series of metallic bumps extend substantially the same distance from said chip such that said bumps are electrically connected to said conductive traces via controlled volume of said conductive material.

13. The circuit of claim 1 wherein said series of metallic bumps include top side surfaces, bottom side surfaces and a bottom end wherein said top side surfaces are essentially free from contact with said conductive material to ensure that said conductive material does not escape from said holes upon displacement by said bumps.

14. The circuit of claim 1 wherein a dielectric passivation layer is connected to said semiconductor chip along a perimeter of a bottom surface thereof to form an insulation layer between said chip and said circuit board while leaving a center portion of said chip exposed to said cavity.

15. The circuit of claim 1 wherein a dielectric passivation ring encircles each of said bumps and is connected to said semiconductor chip.

16. The circuit of claim 1 wherein said series of holes have a diameter, depth and location in said circuit board corresponding to said desired characteristic impedance.

17. A microwave/millimeter wave semiconductor flip chip to circuit board circuit comprising:
   a multi-layer circuit board including a cofired ceramic substrate having a plurality of dielectric layers and conductive traces extending through its volume and between differing dielectric layers of the multi-layer circuit board, and a series of holes extending from a top surface of the circuit board into its volume a sufficient length through one or more of said layers to expose a portion of the conductive traces providing signal transmission lines and ground lines, and wherein said holes may extend to differing levels within the multi-layer circuit board to facilitate routing of said conductive traces;
   a conductive filler material disposed in each of said series of holes and which contacts the exposed portion of the conductive traces thereby forming an electrical connection therewith;
   a semiconductor flip chip having a series of metallic bumps extending from input-output pads thereon and having circuitry for operating with signals having frequencies in the microwave or millimeter wave range, said series of metallic bumps partially extending directly into said series of holes of said circuit board such that the metallic bumps contact the conductive material thereby making electrical connection to the conductive traces and
   at least one cavity formed through one or more layers of said board, said cavity having edges adjacent said holes and a volume beneath said chip for providing an air gap with a selected thickness for protecting circuitry on said chip and further improving high frequency signal operations;
   wherein select signal transmission lines are arranged relative to said ground lines so as to achieve a desired characteristic impedance.

18. The circuit of claim 17 wherein said circuit traces form a stripline circuit configuration.

19. The circuit of claim 17 wherein said circuit traces form a microstrip circuit configuration.

20. The circuit as defined in claim 17 further comprising a controlled thickness cavity extending through one or more layers of said circuit board, said controlled thickness cavity providing a controlled height air gap between said circuit board and said semiconductor flip chip for purposes of preventing damage to circuitry on said chip and further enhancing high frequency signal operations.

21. The circuit as defined in claim 17 wherein said conductive traces have said exposed portion located on a bottom side of the associated hole.

* * * * *